United States Patent
Moczygemba

(10) Patent No.: US 7,531,739 B1
(45) Date of Patent: May 12, 2009

(54) BUILD-IN-PLACE METHOD OF MANUFACTURING THERMOELECTRIC MODULES

(75) Inventor: Joshua E. Moczygemba, Wylie, TX (US)

(73) Assignee: Marlow Industries, Inc., Dallas, TX (US)

( * ) Notice: Subject to any disclaimer, the term of this patent is extended or adjusted under 35 U.S.C. 154(b) by 845 days.

(21) Appl. No.: 10/966,685

(22) Filed: Oct. 15, 2004

(51) Int. Cl.
*H01L 35/30* (2006.01)
*H01L 37/00* (2006.01)
*H01L 35/34* (2006.01)
*H01L 21/324* (2006.01)

(52) U.S. Cl. .................. 136/201; 136/200; 136/203; 136/205; 438/22; 438/54; 438/464; 257/62; 257/633; 257/930

(58) Field of Classification Search .......... 136/201, 136/205, 203; 156/246; 438/54, 464
See application file for complete search history.

(56) References Cited

U.S. PATENT DOCUMENTS

| | | | | |
|---|---|---|---|---|
| 4,032,363 A | * | 6/1977 | Raag | 136/211 |
| 5,064,476 A | | 11/1991 | Recine, Sr. | 136/201 |
| 5,171,372 A | | 12/1992 | Recine, Sr. | 136/203 |
| 5,367,890 A | * | 11/1994 | Doke | 62/3.7 |
| 5,576,512 A | | 11/1996 | Doke | 136/203 |
| 5,705,770 A | | 1/1998 | Ogasawara et al. | 136/205 |
| 5,869,353 A | * | 2/1999 | Levy et al. | 439/109 |
| 5,950,067 A | | 9/1999 | Maegawa et al. | 438/22 |
| 6,274,802 B1 | * | 8/2001 | Fukuda et al. | 136/201 |
| 6,274,803 B1 | | 8/2001 | Yoshioka et al. | 136/201 |
| 6,410,840 B1 | | 6/2002 | Sudo et al. | 136/201 |
| 6,492,585 B1 | * | 12/2002 | Zamboni et al. | 136/201 |
| 6,660,925 B1 | | 12/2003 | Sharp | 136/201 |
| 2002/0028572 A1 | * | 3/2002 | Tatoh et al. | 438/612 |
| 2004/0219306 A1 | * | 11/2004 | Wang et al. | 428/1.5 |
| 2004/0261830 A1 | * | 12/2004 | Sharp et al. | 136/201 |
| 2005/0060884 A1 | * | 3/2005 | Okamura et al. | 29/846 |
| 2005/0126184 A1 | * | 6/2005 | Cauchy | 62/3.3 |

FOREIGN PATENT DOCUMENTS

| | | | | |
|---|---|---|---|---|
| JP | 09293909 A | * | 11/1997 | |
| JP | 10242536 A | * | 9/1998 | |
| JP | 11031805 A | * | 2/1999 | |
| WO | WO-03095711 A2 | * | 5/2003 | |

* cited by examiner

*Primary Examiner*—Alexa D Neckel
*Assistant Examiner*—Golam Mowla
(74) *Attorney, Agent, or Firm*—Baker Botts L.L.P.

(57) ABSTRACT

A method of manufacturing a thermoelectric module is provided. The method includes mounting a thermoelectric material to a substrate such that a portion of the thermoelectric material covers a removable pattern. The thermoelectric material is then segmented and the removable pattern is removed. The portions of the thermoelectric material which were covering the removable pattern are also removed, leaving the portions of the thermoelectric material not covering the removable pattern attached to the substrate.

37 Claims, 13 Drawing Sheets

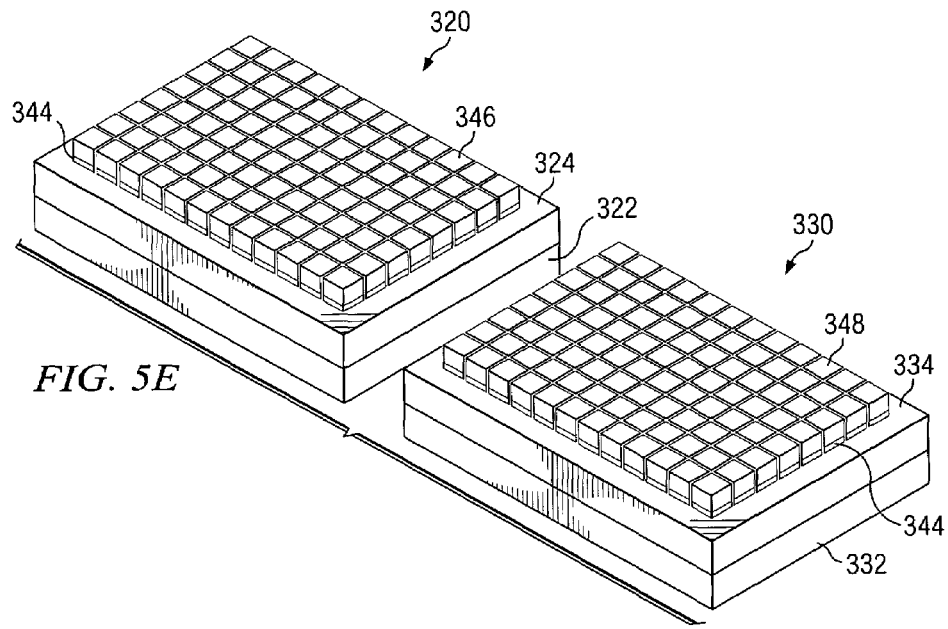
*FIG. 5E*
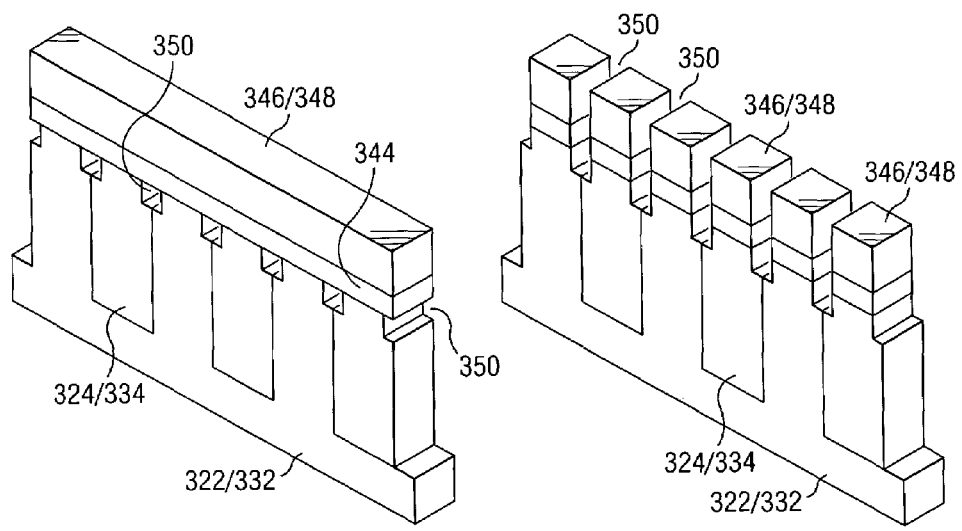
*FIG. 5F*  *FIG. 5G*

BUILD-IN-PLACE METHOD OF MANUFACTURING THERMOELECTRIC MODULES

TECHNICAL FIELD OF THE INVENTION

This invention relates in general to manufacturing thermoelectric modules, and more particularly to a build-in-place method of manufacturing thermoelectric modules.

BACKGROUND OF THE INVENTION

The basic theory and operation of thermoelectric devices has been developed for many years. Presently available thermoelectric devices used for cooling typically include an array of thermocouples which operate in accordance with the Peltier effect. Thermoelectric devices may also be used for heating, power generation and temperature sensing.

Thermoelectric devices may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/fluid heating and cooling components.

Thermoelectric materials such as alloys of $Bi_2Te_3$, PbTe and BiSb were developed thirty to forty years ago. More recently, semiconductor alloys such as SiGe have been used in the fabrication of thermoelectric devices. Typically, a thermoelectric device incorporates both a P-type semiconductor and an N-type semiconductor alloy as the thermoelectric materials.

Due to the size of the P-type and N-type elements, the elements are typically oriented using a vibe loader for installation upon the plate according to a predetermined generally alternating pattern. This method is time-consuming and intricate, requires elements geometries that lend themselves to vibe loading, and requires specialized equipment and experienced operators.

As cooling applications progressively require smaller thermoelectric devices, existing manufacturing techniques have been unable to produce effective solutions. Limitations in vibe loading techniques (due to element geometry) and tedious or impossible hand loading processes do not offer valid solutions.

SUMMARY OF THE INVENTION

In accordance with the present invention, the disadvantages and problems associated with thermoelectric module manufacturing have been substantially reduced or eliminated. In particular, a build-in-place method of manufacture is provided which allows for the manufacture of thermoelectric modules having relatively small thermoelectric elements.

In accordance with one embodiment of the present invention, a method of manufacturing a thermoelectric module includes mounting a thermoelectric material to a temporary substrate such that a portion of the thermoelectric material covers a removable pattern. The thermoelectric material is then segmented and the removable pattern is removed. The portions of the thermoelectric material which were covering the removable pattern are also removed, leaving the portions of the thermoelectric material not covering the removable pattern attached to the temporary substrate. Single or multiple patterns of thermoelectric elements of different types may be fabricated on each temporary substrate. The patterns of a first and second types of thermoelectric material are then transferred to the appropriate permanent ceramics, which are subsequently coupled together to produce the completed thermoelectric module. In a particular embodiment, the removable pattern used to create the removable mask is a water soluble material. In another particular embodiment, the temporary substrate includes guide marks not covered by the thermoelectric material which indicate the edges of the removable pattern and where to cut the thermoelectric material.

In accordance with another embodiment of the present invention, a method of manufacturing a thermoelectric module includes mounting a thermoelectric material to a temporary substrate and segmenting the thermoelectric material into blocks. Alternating blocks of the thermoelectric material are removed, leaving a pattern of the thermoelectric material on the substrate. In a particular embodiment, alternating blocks of the thermoelectric material are removed by removing a removable pattern from the temporary substrate. The temporary substrate may include a pattern of raised blocks, and the removable pattern may include a plate with a pattern of holes cut from it. The pattern of holes on the removable pattern corresponds to the pattern of raised blocks on the temporary substrate In accordance with another embodiment of the present invention, a temporary substrate includes a plurality of thermoelectric elements and a removable pattern coupled to the temporary substrate. Every other thermoelectric element of the plurality of thermoelectric elements is disposed over the removable pattern and removing the removable pattern also removes the thermoelectric elements disposed over the removable pattern. The thermoelectric elements which were not disposed over the removable pattern remain coupled to the temporary substrate.

Technical advantages of certain embodiments of the present invention include using the array of thermoelectric elements produced from segmenting a thermoelectric wafer to manufacture a thermoelectric module having relatively small thermoelectric elements. Thus, the use of hand or vibe loading techniques is reduced or eliminated.

Other technical advantages of certain embodiments of the present invention include the ability to manufacture thermoelectric modules containing smaller thermoelectric elements than can be easily and/or accurately manipulated by hand. Complicated element vibe load, hand load and pick and place operations are reduced or eliminated during the thermoelectric module construction. The method takes advantage of the element orientation present after wafer segmenting by using special temporary substrates to hold element orientation for the module assembly steps. The temporary substrates may be disposable or reusable. Disposable substrates may be processed using special removable masking techniques while reusable substrates may take advantage of special interlocking techniques.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which:

FIGS. 5A-5M illustrate a further alternative embodiment of a method of manufacturing thermoelectric devices having multiple thermoelectric elements.

DETAILED DESCRIPTION OF THE INVENTION

Figure 1:
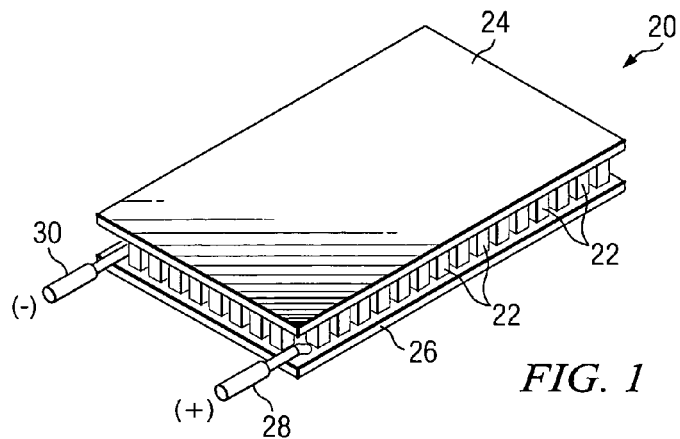
FIG. 1 is a schematic drawing showing an isometric view of a thermoelectric device having multiple thermoelectric elements.

Traditional thermoelectric devices are built with arrays of P-type and N-type semiconductor material coupled electrically in series and thermally in parallel. A typical method of constructing such a device is to separately segment wafers of P and N type material into elements of the preferred geometric sizes. The individual elements are then dismounted from the mounting plates and rearranged by hand, vibe loading techniques, or robotic placement into the desired pattern of P-type and N-type elements. In this method of assembly, the array created by the segmenting process is not used to any advantage. The present invention provides a system and method of utilizing the arrays created during segmentation to more efficiently manufacture thermoelectric devices.

The subject of the present invention relates to constructing thermoelectric modules without handling individual elements. The method reduces or eliminates the need for hand loading, vide loading, or pick and placing individual elements via robot or automated placing techniques. Complicated element vibe load, hand load and pick and place operations are reduced or eliminated during the thermoelectric module construction. The method takes advantage of the element orientation present after wafer segmenting by using special temporary substrates to hold element orientation for the module assembly steps. The temporary substrates may be disposable or reusable. Disposable substrates may be processed using special removable masking techniques while reusable substrates may take advantage of special interlocking techniques.

Particular embodiments of the present invention provide for a specially patterned temporary mounting plate to serve as a fixture for segmenting thermoelectric wafers. The mounting plate is prepared with a removable mask that produces the desired elemental array after dicing the wafers and removing the mask. In this manner, the removable mask is used to make the P-type and N-type arrays. The elemental arrays are then coupled to their permanent substrates, P-type thermoelectric material to one substrate and N-type thermoelectric material to another. The temporary substrates are then removed from the arrays, and the two permanent substrates, with their respective elements, are combined in a final coupling step to produce a complete thermoelectric unit.

Particular embodiments of the present invention also provide for a specially constructed, two piece, interlocking, temporary dicing carrier which is used to mount thermoelectric wafers for dicing. One P-type or one N-type thermoelectric wafer is coupled to each carrier. After dicing, the individual pieces of the carrier are separated, each piece preserving a portion of the original, single type material array. Then P-type and N-type pieces from each carrier are interlocked with each other forming the desired array of P-type and N-type elements. A permanent ceramic is then coupled to the elements and the temporary mounting plate removed. The second ceramic may be added in a final coupling step to complete the thermoelectric device.

FIG. 1 illustrates a thermoelectric device 20 including a plurality of thermoelectric elements 22 disposed between a cold plate 24 and a hot plate 26. Electrical connections 28 and 30 are provided to allow thermoelectric device 20 to be electrically coupled with an appropriate source of DC electrical power.

Thermoelectric device 20 may be used as a heater, cooler, electrical power generator and/or temperature sensor. If thermoelectric device 20 were designed to function as an electrical power generator, electrical connections 28 and 30 would represent the output terminals from such a power generator operating between hot and cold temperature sources.

Figure 2:
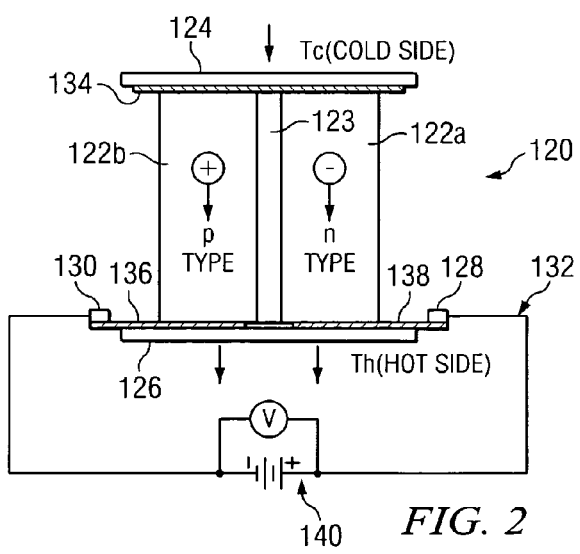
FIG. 2 is an electrical schematic drawing of one thermocouple of the thermoelectric device of FIG. 1.

FIG. 2 is a schematic representation of an electrical circuit 132 of a single stage thermoelectric device 120. Electrical circuit 132 may also be incorporated into thermoelectric elements or thermocouples to convert heat energy into electrical energy. Electrical circuit 132 generally includes two or more thermoelectric elements 122 fabricated from dissimilar semiconductor materials such as N-type thermoelectric elements 122a and P-type thermoelectric elements 122b. Thermoelectric elements 122 are typically configured in a generally alternating N-type element to P-type element arrangement and typically include an air gap 123 disposed between adjacent N-type and P-type elements. In many thermoelectric devices, thermoelectric materials with dissimilar characteristics are connected electrically in series and thermally in parallel.

Examples of thermoelectric devices and methods of fabrication are shown in U.S. Pat. No. 5,064,476 entitled Thermoelectric Cooler and Fabrication Method; U.S. Pat. No. 5,171,372 entitled Thermoelectric Cooler and Fabrication Method; and U.S. Pat. No. 5,576,512 entitled Thermoelectric Apparatus for Use With Multiple Power Sources and Method of Operation.

N-type semiconductor materials generally have more electrons than necessary to complete the associated crystal lattice structure. P-type semiconductor materials generally have fewer electrons than necessary to complete the associated crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers which transport or move heat energy between cold side or cold plate 124 and hot side or hot plate 126 through thermoelectric elements 122 when subject to a DC voltage potential. These same agents or carriers may generate electrical power when an appropriate temperature difference is present between cold side 124 and hot side 126.

In thermoelectric device 120, alternating thermoelectric elements 122a, and 122b of N-type and P-type semiconductor materials may have their ends connected by electrical conductors such as 134, 136 and 138. Conductors 134, 136 and 138 may be metalizations formed on thermoelectric elements 122a, 122b and/or on the interior surfaces of plates 124 and 126. Ceramic materials are frequently used to manufacture plates 124 and 126 which define in part the cold side and hot side, respectively, of thermoelectric device 120. Commercially available thermoelectric devices which function as a cooler generally include two ceramic plates with separate P-type and N-type thermoelectric elements formed from bismuth telluride ($Bi_2Te_3$) alloys disposed between the ceramic plates and electrically connected with each other.

When DC electrical power from power supply 140 is properly applied to thermoelectric device 120 heat energy will be absorbed on cold side 124 of thermoelectric elements 122 and will be dissipated on hot side 126 of thermoelectric device 120. A heat sink or heat exchanger (sometimes referred to as a "hot sink") may be attached to hot plate 126 of thermoelectric device 120 to aid in dissipating heat transferred by the associated carriers and phonons through thermoelectric elements 122 to the adjacent environment. In a similar manner, a heat sink or heat exchanger (sometimes referred to as a "cold sink") may be attached to cold side 124 of thermoelectric device 120 to aid in removing heat from the adjacent environment. Thus, thermoelectric device 120 may sometimes function as a thermoelectric cooler when properly connected with power supply 140. However, since thermoelectric devices are a type of heat pump, thermoelectric device 120 may also function as a heater, power generator, or temperature sensor.

FIGS. 3A-3K illustrate one embodiment of a method of manufacturing a thermoelectric device. Method of manufacture 200 is illustrated pictorially in FIGS. 3A-3K. Method of manufacture 200 starts in FIG. 3A, in which temporary substrates 232 and blocks of thermoelectric materials 234 and 236 are cleaned. In the illustrated embodiment, thermoelectric material 234 is a N-type material and thermoelectric material 236 is a P-type material. Thermoelectric material 234 may be any N-type material and thermoelectric material 236 may be any P-type material. Temporary substrates 232 may be any supporting material, and, in one embodiment, is an Aluminum Oxide (AlO) substrate.

In the illustrated embodiment the temporary substrates 232 and the thermoelectric materials 234 and 236 are shown as rectangular blocks. This is for illustrative purposes only, and it will be understood by one of ordinary skill in the art that the temporary substrates 232 and the thermoelectric materials 234 and 236 may take any shape and be of any desired dimensions such that the end results of method of manufacture 200 are thermoelectric modules of any particular desired shape and/or dimensions.

Figure 3A:
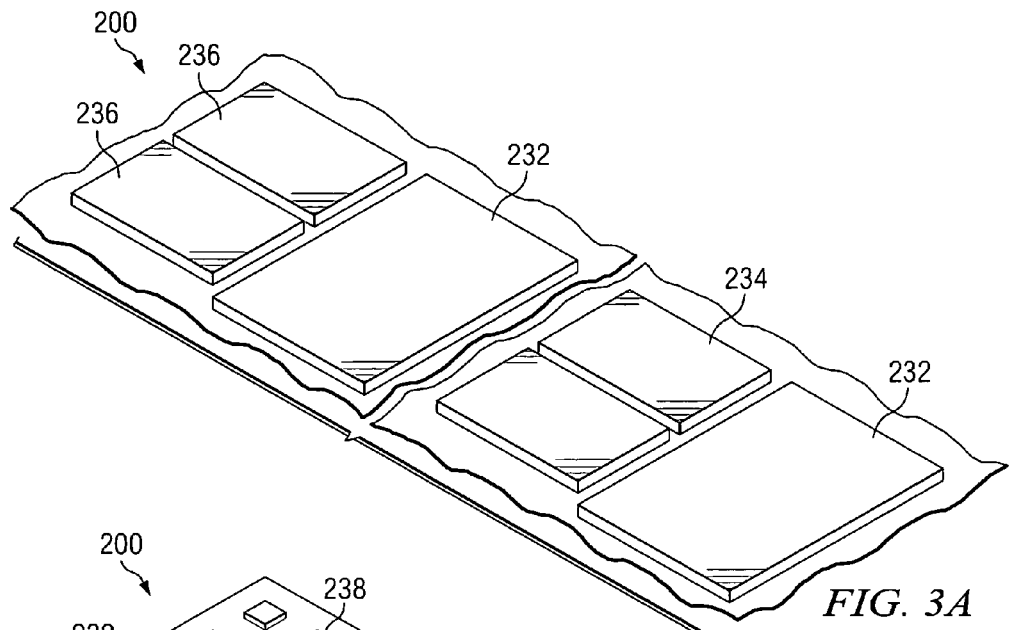
FIGS. 3A-3K illustrate a method of manufacturing thermoelectric devices having multiple thermoelectric elements.
Figure 3B:
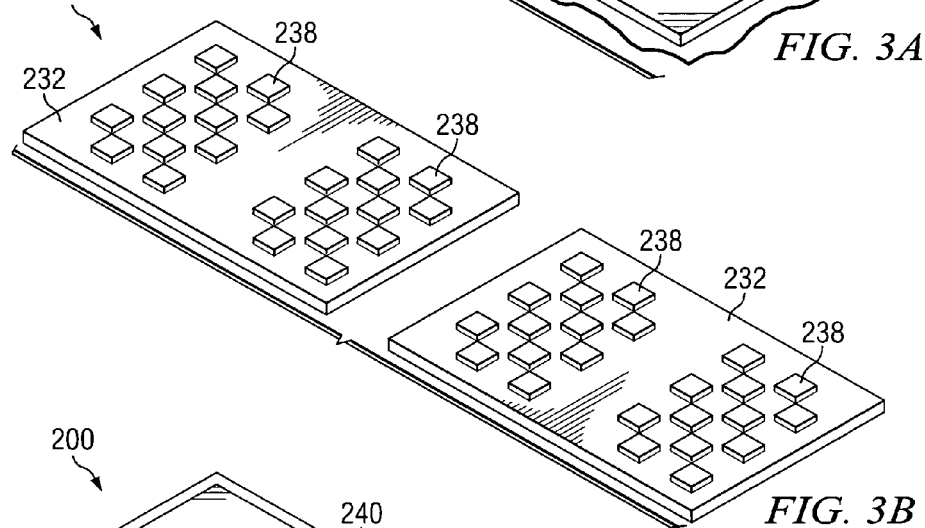

Once the temporary substrates 232 have been cleaned, as illustrated in FIG. 3A, removable patterns 238 are applied to them, as illustrated in FIG. 3B. Removable patterns 238 are removed in a later step leaving behind the desired pattern of thermoelectric materials 234 and 236. Therefore, removable patterns 238 may be applied in the areas of temporary substrates 232 where thermoelectric materials 234 and 236 are not desired.

Removable patterns 238 can be applied in a variety of ways. For instance, in certain embodiments, removable patterns 238 may be printed on temporary substrates 232, sprayed onto temporary substrates 232, or brushed onto temporary substrates 232. In alternative embodiments, any method capable of applying a suitable, removable material in the desired pattern may be utilized.

Figure 3C:
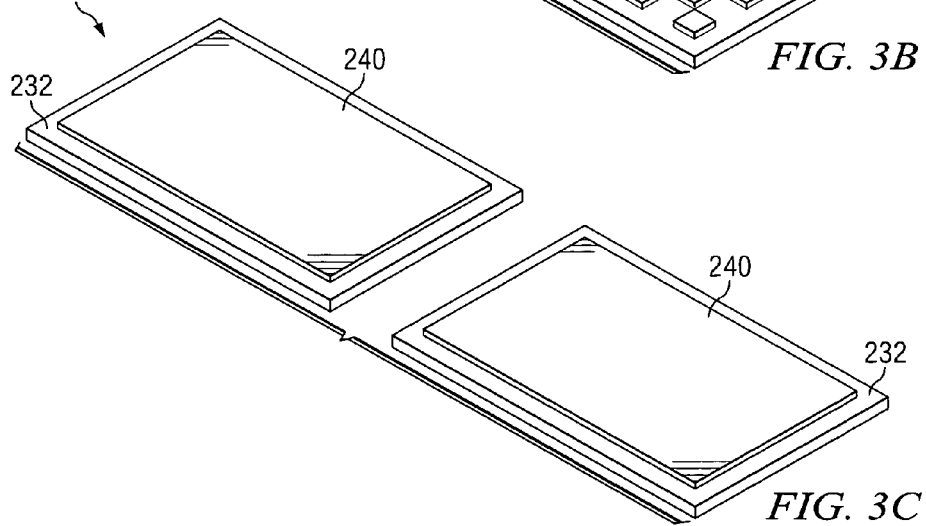

After removable patterns 238 are applied, a bonding media 240 is applied over removable patterns 238 and temporary substrates 232. This is illustrated in FIG. 3C. Bonding media 240 and removable patterns 238 will be removed at different stages in method of manufacture 200. Therefore, removable patterns 238 and bonding media 240 should have sufficiently different properties, such that a particular solvent may be used to remove one while not removing the other. Specifically, since removable patterns 238 will usually be removed prior to removal of bonding media 240, removable patterns 238 should be removable by a solvent which will not remove bonding media 240. In one embodiment, removable patterns 238 are water soluble while bonding media 240 is not. Specifically, removable patterns 238 may be water soluble polymer, such as a water soluble solder mask while bonding media 240 may be a non-water soluble shellac or epoxy, such as a two part bisphenol-A-polyglicidyl ether resin and a polyamine hardener, such as JB Weld™.

Figure 3D:
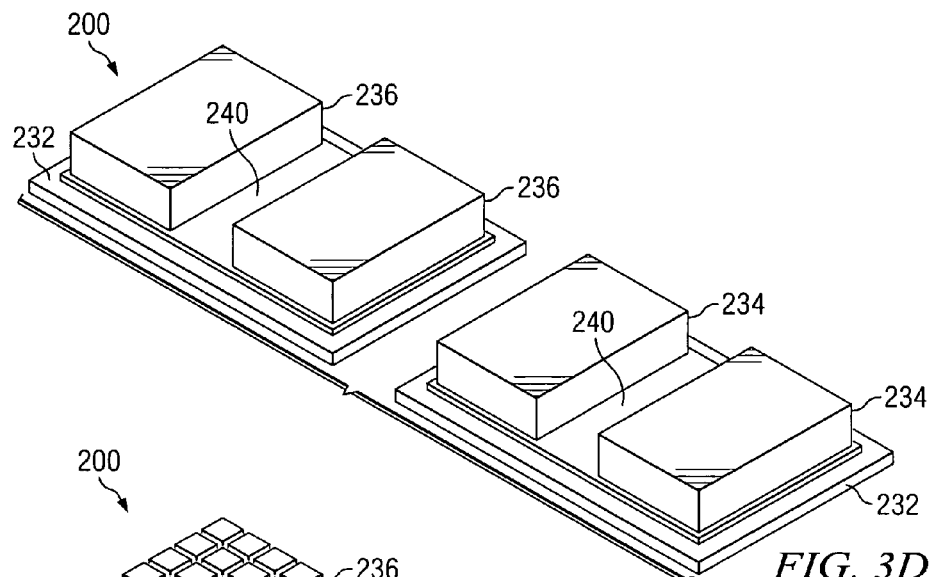

FIG. 3D illustrates thermoelectric materials 234 and 236 coupled to bonding media 240 and to temporary substrates 232. Once coupled, bonding media 240 may be allowed to set prior to continuing with method of manufacture 200. Depending on the bonding media 240 selected, the setting time may be reduced by utilizing a curing cycle involving positive pressure applied to the bonding media 240 and/or an elevated ambient temperature surrounding bonding media 240.

FIG. 3D illustrates two blocks of thermoelectric material 234 and two blocks of thermoelectric material 236 being mounted to their respective temporary substrates 232. Alternative embodiments may have any number of blocks, or other shapes, of thermoelectric materials 234 and 236 in any desired configuration. In such an embodiment, temporary substrates 232 may be designed to accommodate the desired number and configuration of blocks of thermoelectric materials 234 and 236.

Figure 3E:
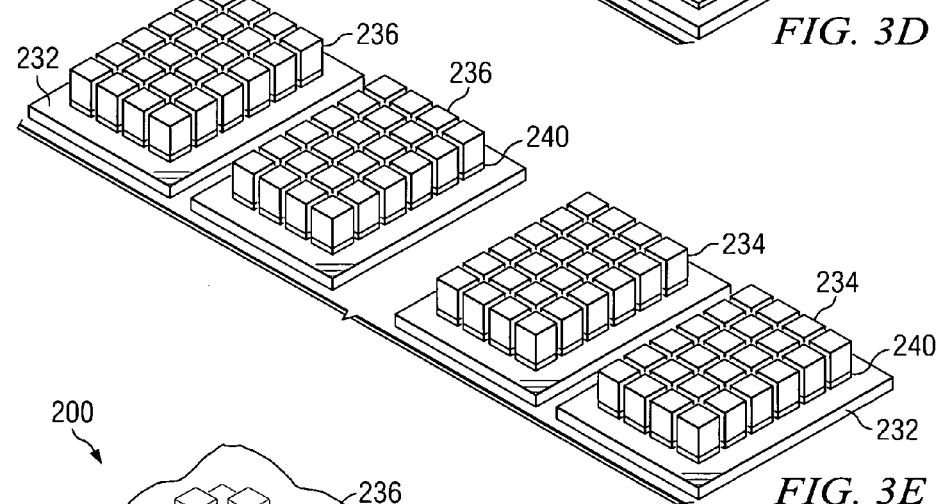

Once bonding media 240 has set, thermoelectric materials 234 and 236 are segmented, as illustrated in FIG. 3E. In the illustrated embodiment thermoelectric materials 234 and 236 have been divided into right-angled rectangular prisms. Alternative embodiments may divide thermoelectric materials 234 and 236 into cubes or any shape which is desirable for a particular application.

In one embodiment, thermoelectric materials 234 and 236 may be segmented by cutting them with thin blades according to a dicing technique. Alternative embodiments may segment thermoelectric materials 234 and 236 by other dicing techniques, laser cutting, etching, wire saw, abrading, or electro discharge machining (EDM).

Segmenting of thermoelectric materials 234 and 236 occurs according to removable patterns 238 which, in turn, indicate desired residual patterns 244 on the temporary substrates 232. Segmenting occurs such that thermoelectric materials 234 and 236 over removable patterns 238 and desired residual patterns 244 remain after segmenting. In the illustrated embodiment, removable patterns 238 are checkered patterns wherein the blank spaces indicate the desired residual patterns 244, which are also checkered patterns. This configuration of removable patterns 238 and the desired residual patterns 244 requires only straight line cuts for segmenting and results in the post segmenting arrangement of thermoelectric materials 234 and 236 illustrated in FIG. 3E. In another embodiment, the thermoelectric materials 234 and 236 over removable patterns 238 are simultaneously removed during the segmenting operation by the presence of the solvent during segmenting.

Temporary substrates 232 have also been segmented in FIG. 3E. In certain embodiments this may be accomplished at the same time and in the same manner as the segmenting of thermoelectric materials 234 and 236. However, alternative embodiments may segment temporary substrates 232 using a different method than the method used to segment thermoelectric materials 234 and 236. Further, segmenting temporary substrates 232 does not need to occur at the same time that thermoelectric materials 234 and 236 are segmented. In certain embodiments of method of manufacture 200, temporary substrates 232 may not be segmented because it is only supporting thermoelectric material for one thermoelectric module. In alternative embodiments, temporary substrates 232 may be supporting thermoelectric material for more than one thermoelectric module, but it may be desirable to wait until a later step in method of manufacture 200 to segment temporary substrates 232, or it may be decided that it is not desirable to segment temporary substrates 232.

Figure 3F:
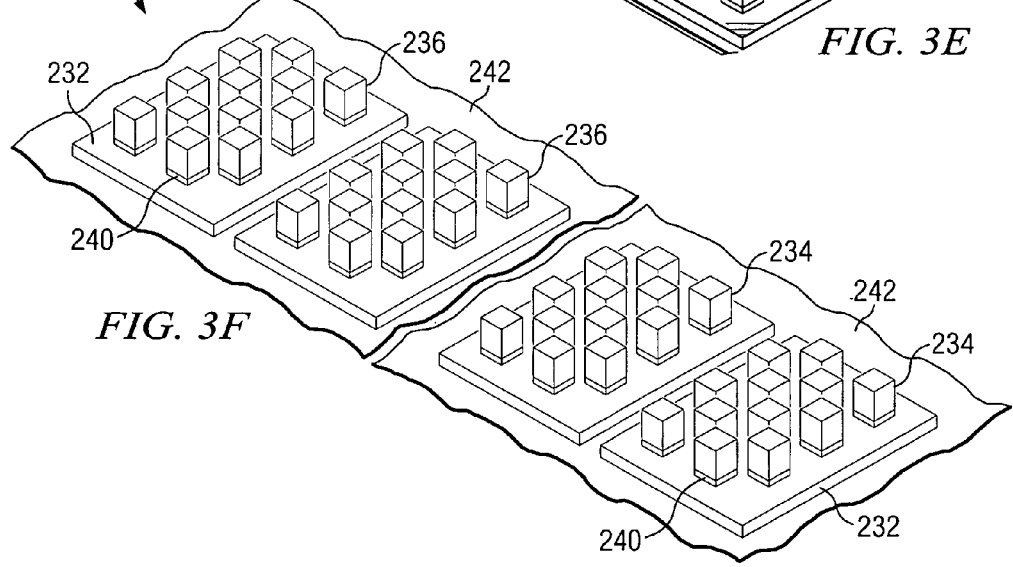

In FIG. 3F, the segmented thermoelectric materials 234 and 236 and temporary substrates 232 are illustrated as being washed in a solvent 242 capable of removing the temporary patterns 238, but not the bonding media 240. Therefore, removable patterns 238 and thermoelectric materials 234 and 236 covering removable patterns 238 are released from temporary substrates 232. Desired residual patterns 244 remain attached to the temporary substrates 232 by bonding media 240. In the illustrated embodiment, desired residual patterns 244 are checkered patterns. In one embodiment, as discussed above, solvent 242 may be water.

Figure 3G:
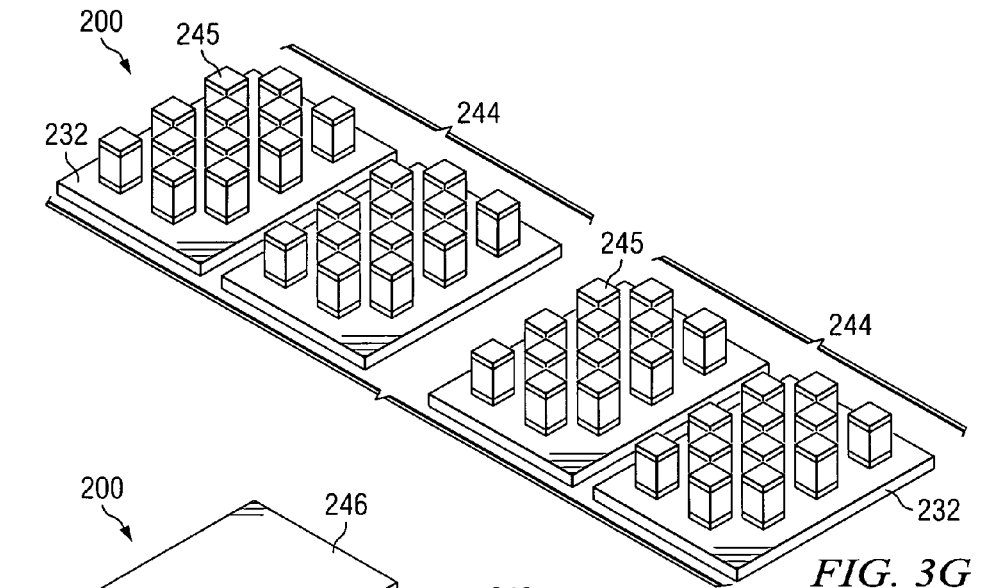
Figure 3H:
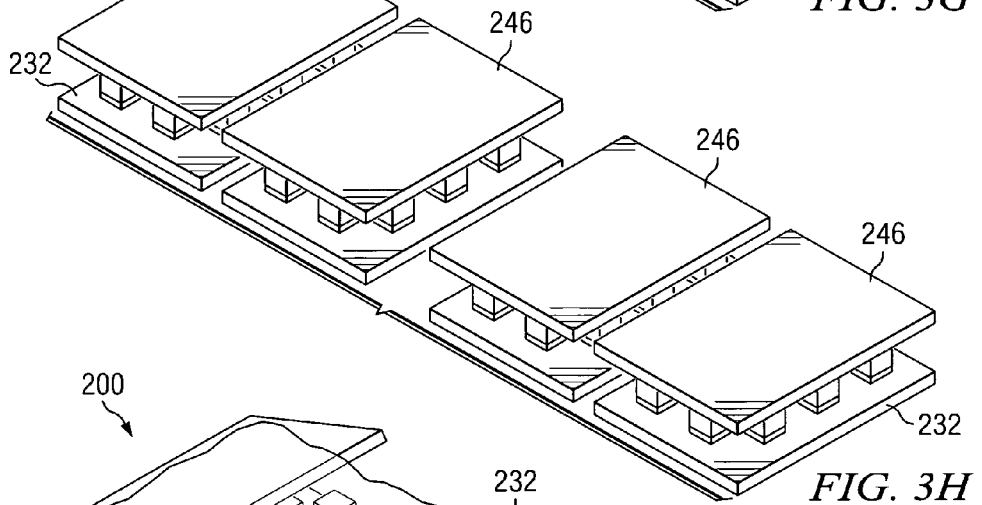

FIG. 3G illustrates desired residual patterns 244 attached to temporary substrates 232 by bonding media 240. IN FIG. 3G, a bonding media 245 has been applied to the top of desired residual patterns 244. Bonding media 245 couples desired residual patterns 244 to permanent substrates 246, illustrated in FIG. 3H. In an alternative embodiment, bonding media 245 is not applied to the desired residual patterns 244, but is instead applied to permanent substrates 246. A further alternative embodiment may apply a bonding media to both the top of desired residual patterns 244 and permanent substrates 246, the bonding medias being the same or different. In certain embodiments, bonding media 245 may be solder, conductive epoxy, or any other means for electrical and thermal connection. In FIG. 3H, permanent substrates 246 are coupled to the tops of desired residual patterns 244 of thermoelectric materials 234 and 236.

Figure 3I:
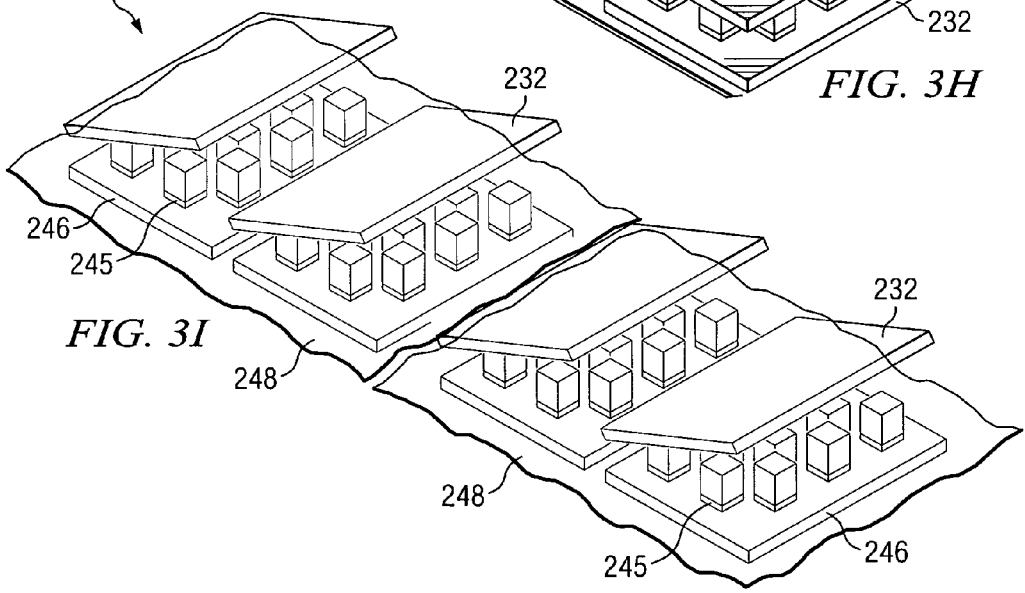

FIG. 3I illustrates the removal of bonding media 240, applied to temporary substrates 232 and used to couple thermoelectric materials 234 and 236 to temporary substrates 232. Bonding media 245 may be selected such that bonding media 245 will not be removed by the solvent used to remove bonding media 240. In this manner, bonding media 240 may be removed without concern of damaging the connection between permanent substrates 246 and thermoelectric materials 234 and 236.

In FIG. 3I, temporary substrates 232 are shown being removed from thermoelectric materials 234 and 236. Separation of temporary substrates 232 from thermoelectric materials 234 and 236 is achieved by removing bonding media 240 with solvent 248. In one embodiment, solvent 248 may be n-methyl pyrrolidone. In alternative embodiments, solvent 248 may be chosen based on the bonding media 240 used and may be any solvent capable of dissolving or softening bonding media 240 to the point where temporary substrates 232 may be removed.

Figure 3J:
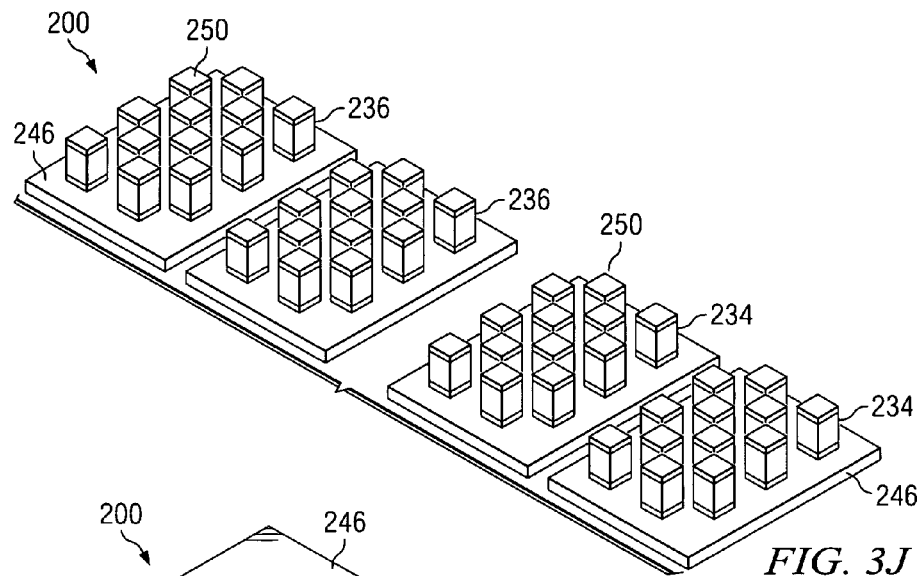

FIG. 3J illustrates the result of removing bonding media 240. Permanent substrates 246 with checkered patterns of thermoelectric material 234 and permanent substrates 246 with checkered patterns of thermoelectric material 236 are illustrated. A bonding media 250 is shown applied to what is now the tops of thermoelectric materials 234 and 236. Alternatively, bonding media 250 is not applied to the tops of thermoelectric materials 234 and 236, but is instead applied to permanent substrates 246 between thermoelectric materials 234 and 236. A further alternative embodiment may apply a bonding media to both the tops of thermoelectric materials 234 and 236 and permanent substrates 246 between thermoelectric materials 234 and 236, the bonding medias being the same or different. In certain embodiments, bonding media 250 may be solder, conductive epoxy, or any other means for electrical and thermal connection.

Figure 3K:
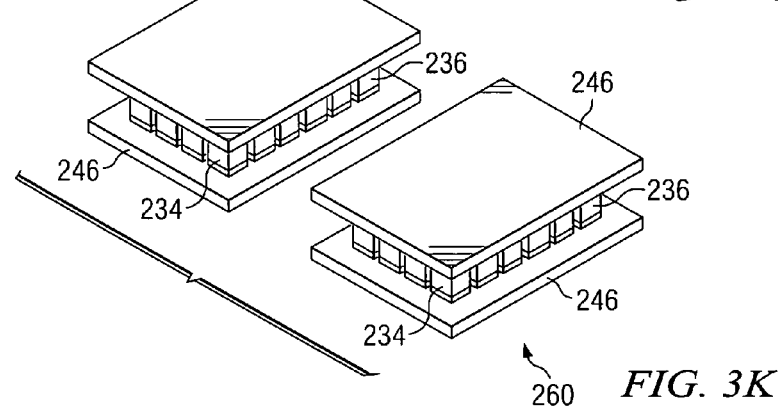

In FIG. 3K, each of the two permanent substrates 246, including thermoelectric material 234, have been inverted and placed on top of permanent substrates 246, including thermoelectric material 236. This combination forms thermoelectric modules 260. The permanent substrates 246 and the thermoelectric materials 234 and 236 making up thermoelectric modules 260 are held together by bonding media 245 and bonding media 250. Bonding media 245 and bonding media 250 may be the same bonding media or may be different bonding medias.

Permanent substrates 246 are configured to electrically couple the pattern of thermoelectric materials 234 and 236. As discussed above and illustrated in FIG. 2, the thermoelectric materials 234 and 236 are connected electrically in series and thermally in parallel. In one embodiment, permanent substrates 246 may contain electrical interconnects, such as patterned metallizations, to provide these connections. In such an instance, the top and bottom permanent ceramics in a thermoelectric module may have differing electrical interconnect patterns in order to create the desired electrical circuit and may also be different in size.

Method of manufacture 200 may be altered from the description above without straying from the scope of the present invention. For instance, in one embodiment, segmentation of temporary substrates 232 may not occur at the same time the thermoelectric material is segmented. Instead, temporary substrates 232 may never be segmented. In one instance of this embodiment, separate permanent substrates 246 may be coupled to the thermoelectric materials 234 and 236. In another instance of this embodiment, a single permanent substrate with multiple patterns may be coupled to the thermoelectric materials 234 and 236 and the permanent substrates 246 may be segmented into individual patterns at a later step. The embodiments of method of manufacture 200 apply to processing individual parts as well as arrays of parts.

Figure 4:
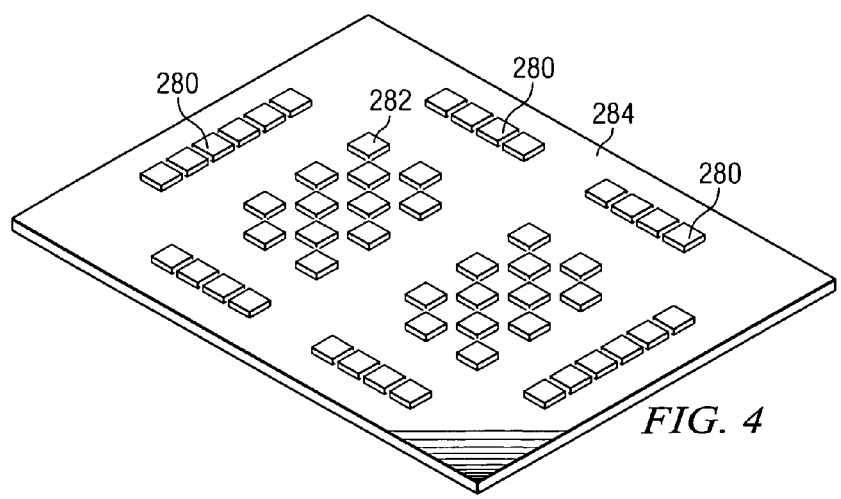
FIG. 4 illustrates an alternative embodiment of a method of manufacturing thermoelectric devices having multiple thermoelectric elements.

FIG. 4 illustrates an alternative embodiment of a method of manufacturing thermoelectric modules. The illustrated method uses guide marks 280 corresponding to removable patterns 282 to indicate where materials are to be segmented. Guide marks 280 may be of the same composition as removable patterns 282 and may be applied to temporary substrate 284 at the same time and via the same method. Guide marks 280 indicate where removable patterns 282 are located under the thermoelectric materials. Therefore, guide marks 280 may be used to properly align the blades, wires, or lasers, or indicate what material to remove during an EDM process.

A further alternative embodiment of the present invention is illustrated by FIGS. 5A-5M. Throughout the description of the embodiment illustrated by FIGS. 5A-5M, the method illustrated therein will be referred to as method of manufacture 300.

Figure 5A:
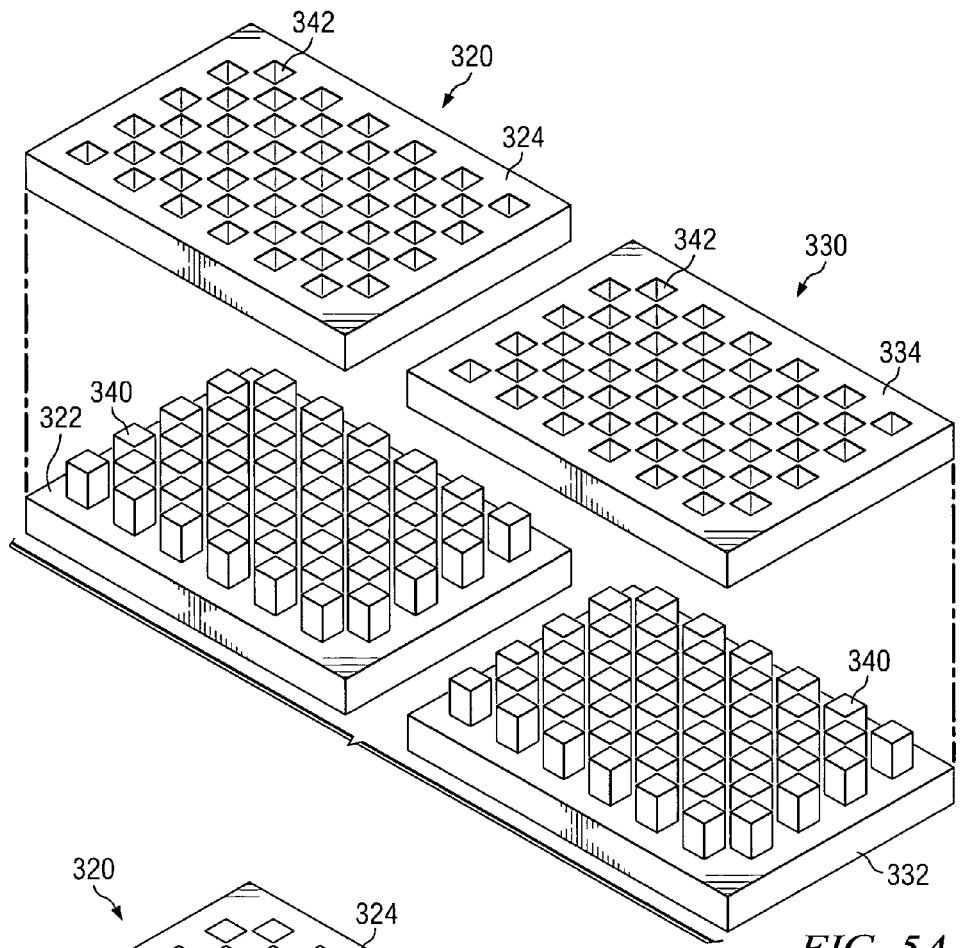

Method of manufacture 300 begins with two reusable interlocking temporary substrates as illustrated in FIG. 5A. These interlocking temporary substrates will be referred to as N substrate 320 and P substrate 330. Each of the interlocking temporary substrates is made up of two pieces, a removable pattern, which will be referred to as a top, and a substrate, which will be referred to as a bottom. Specifically, N substrate 320 includes N bottom 322 and N top 324. P substrate 330 includes P bottom 332 and P top 334.

As can be seen in FIG. 5A, N bottom 322 and P bottom 332 each include a plurality of raised blocks 340 arranged in a checkered pattern. N top 324 and P top 334 each include a plurality of square shaped holes 342 arranged in a checkered pattern corresponding to the checkered pattern of raised blocks 340.

Figure 5B:
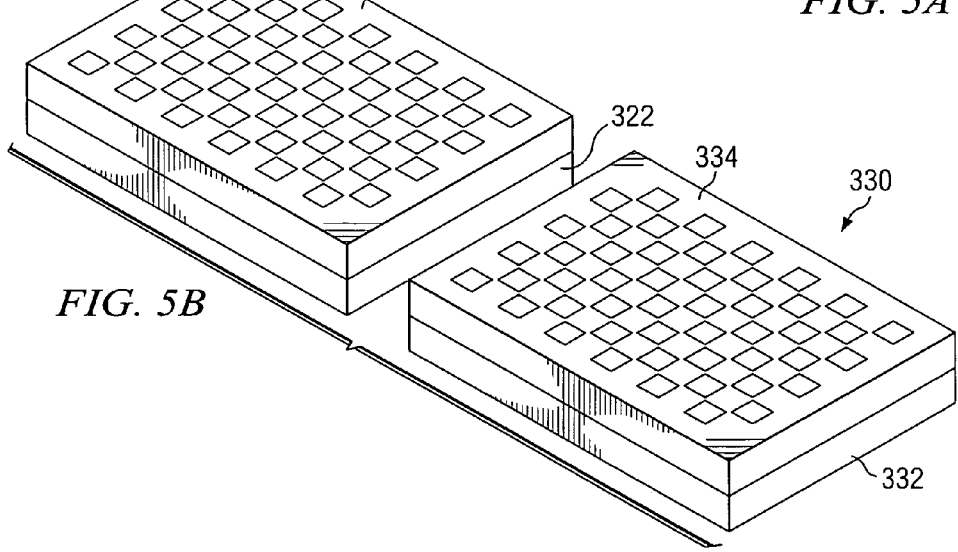

FIG. 5B illustrates N bottom 322 coupled to N top 324 and P bottom 332 coupled to P top 334. Raised blocks 340 present on N bottom 322 and P bottom 332 mate with the corresponding square holes 342 on N top 324 and P top 334. In the illustrated embodiment, N top 324 may be coupled to P bottom 332 in the same manner that N top 324 couples to N bottom 322. Similarly, P top 334 may be coupled to N bottom 322 in the same manner that P top 334 couples to P bottom 332. In this manner, N top 324 and P top 334 are interchangeable, as are N bottom 322 and P bottom 332.

When the tops 324 and 334 are coupled to the bottoms 322 and 332 in any of the configurations described above, the tops of raised blocks 340 are substantially flush with the upper surface of the tops 324 and 334. In this manner a substantially flat mounting surface is provided by the combination of either top 324 or 334 with either bottom 322 or 332.

In the illustrated embodiment, N substrate 320 and P substrate 330 have square shaped interfaces between their two components. One alternative embodiment may include rectangular interfaces between the components of N substrate 320 and P substrate 330. Further alternative embodiments may have interfaces of any desired shape.

Figure 5C:
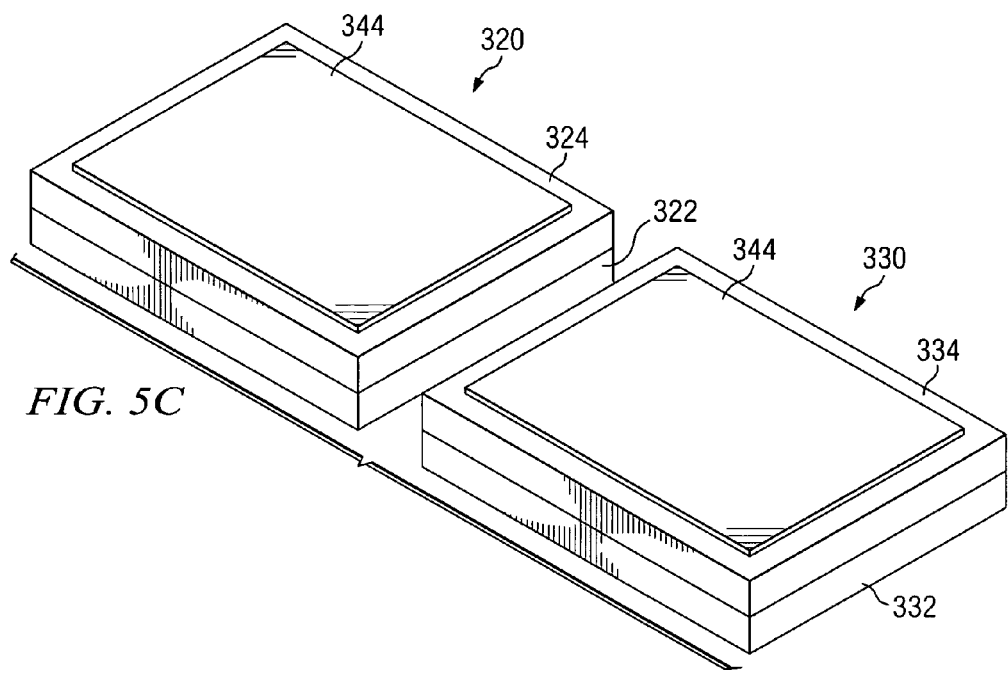

In FIG. 5C, N top 324 is coupled to N bottom 322 and P top 334 is coupled to P bottom 332. The surfaces of N substrate 320 and P substrate 330 have been cleaned and a bonding media 344 has been applied to their top surfaces. In one embodiment, bonding media 344 may comprise a double sided polyimide tape. In alternative embodiments, any appropriate bonding media may be used.

Figure 5D:
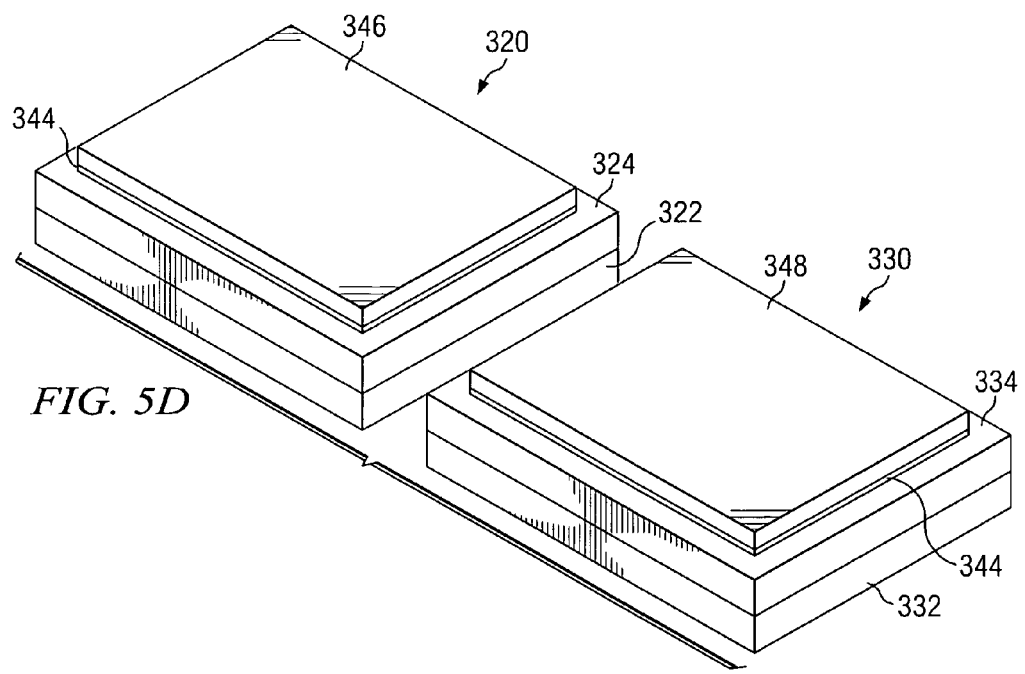

In FIG. 5D, thermoelectric materials have been coupled to bonding media 344 and to the substrates 320 and 330. Specifically, a N-type thermoelectric material 346 has been coupled to N substrate 320 and a P-type thermoelectric material 348 has been coupled to P substrate 330.

Once coupled, bonding media 344 may be allowed to set prior to continuing with method of manufacture 300. Depending on the bonding media 344 selected, the setting time may be reduced by utilizing a curing cycle involving positive pressure applied to boding media 344 and/or an elevated ambient temperature surrounding bonding media 344.

Once bonding media 344 has set, the thermoelectric materials 346 and 348 are segmented as shown in FIG. 5E. In one embodiment, thermoelectric materials 346 and 348 may be segmented by cutting them with thin blades according to a dicing technique. In alternative embodiments, thermoelectric material 346 and 348 may be segmented by other dicing techniques, etching, wire saw, abrading, laser cutting, or electro discharge machining (EDM).

As illustrated by FIG. 5E, thermoelectric materials 346 and 348 have been segmented according to the pattern formed by the interfaces of tops 324 and 334 with bottoms 322 and 332. In the illustrated embodiment, the interfaces of tops 324 and 334 with bottoms 322 and 332 are square interfaces. In alternative embodiments, the interface of tops 324 and 334 with bottoms 322 and 332 may have rectangular interfaces, resulting in rectangular patterns of N-type thermoelectric material 346 and P-type thermoelectric material 348. Further alternative embodiments may have any desired interface geometry and result in any desired pattern of thermoelectric materials 346 and 348.

FIGS. 5F and 5G demonstrate one embodiment of N substrate 320 or P substrate 330. In the illustrated embodiment, the top 324/334 and the bottom 322/332 have recessed channels 350 cut into them. Recessed channels 350 may act as guides to aid in the segmenting of thermoelectric material 346/348. In certain embodiments, recessed channels 350 may be used to align cutting blades or indicate where to cut thermoelectric material 346/348 so as not to damage top 324/334 or bottom 322/332.

Figure 5H:
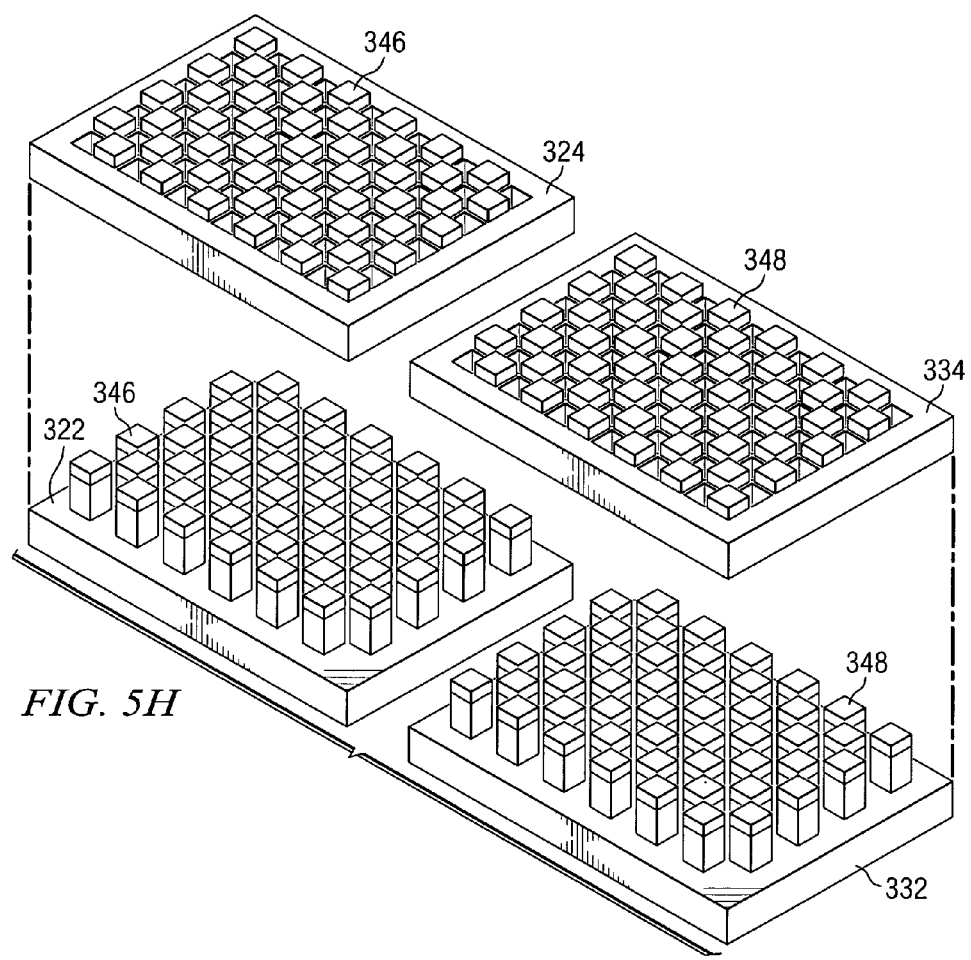

FIG. 5H illustrates the removal of N top 324 from N bottom 322 and P top 334 from P bottom 332. After N top 324 is removed from N bottom 322, a checkered pattern of N-type thermoelectric material 346 remains attached to N top 324 by bonding media 344. Correspondingly, a checkered pattern of N-type thermoelectric material 346 remains attached to N bottom 322 by bonding media 344. In a similar manner, after P top 334 is removed from P bottom 332, a checkered pattern of P-type thermoelectric material 348 remains attached to P top 334 by bonding media 344. Correspondingly, a checkered pattern of P-type thermoelectric material 348 remains attached to P bottom 332 by bonding media 344.

Figure 5I:
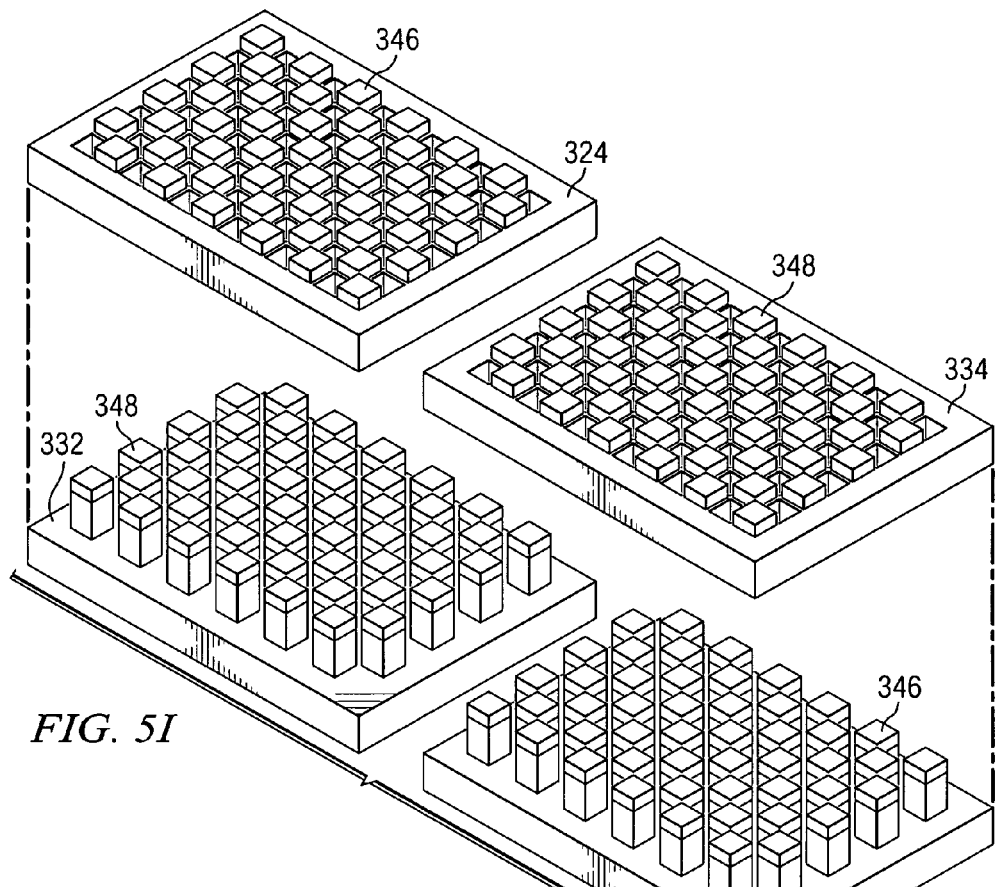
Figure 5J:
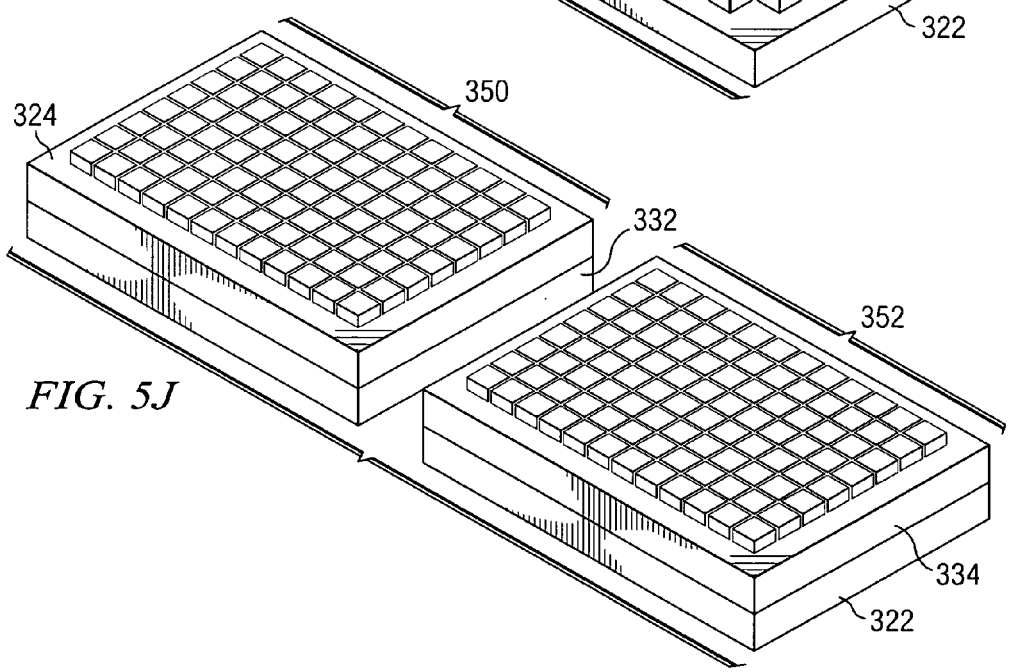

In FIG. 5I, N bottom 322 has been swapped with P bottom 332. In FIG. 5J N top 324 is coupled to P bottom 332 and P top 334 is coupled to N bottom 322. The result of this decoupling, swapping, and recoupling is two checkered patterns of alternating N-type thermoelectric material 346 and P-type thermoelectric material 348. Due to the swapping of N bottom 322 with P bottom 332, the two checkered patterns of thermoelectric materials 346 and 348 may be mirror images of the other. The checkered pattern of thermoelectric materials 346 and 348 formed by the coupling of N top 324 with P bottom 332 is labeled matrix 350. The checkered pattern of thermoelectric materials 346 and 348 formed by the coupling of P top 334 with N bottom 322 is labeled matrix 352.

Figures 5K, 5L:
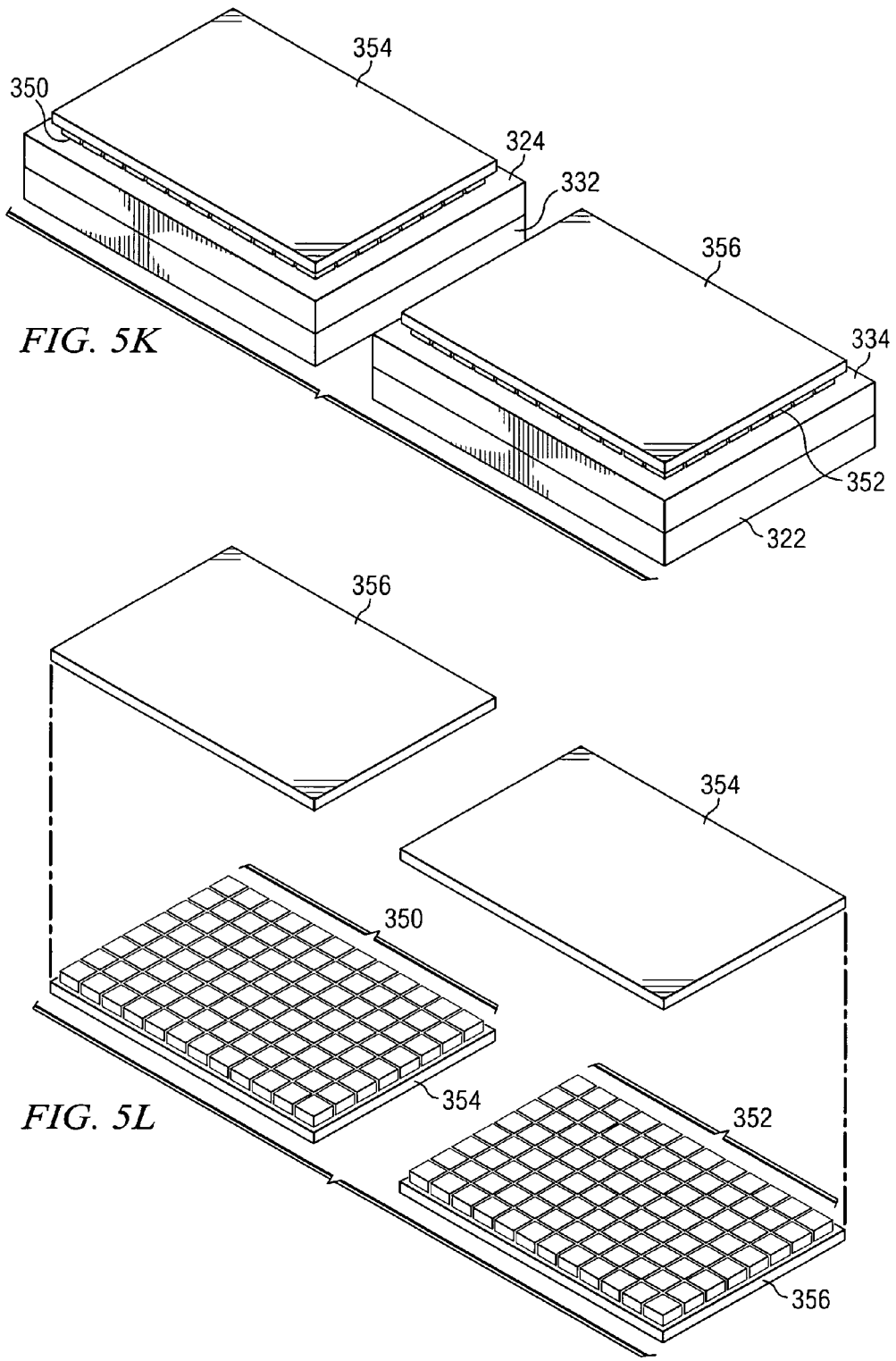

In FIG. 5K, a top base plate 354 is coupled to matrix 350 and a bottom base plate 356 is coupled to matrix 352. Base plates 354 and 356 are coupled to matrices 350 and 352 using a bonding media. In certain embodiments, the bonding media may be solder, conductive epoxy, or any other means for electrical and thermal connection.

In FIG. 5L, N top 324 and P bottom 332 have been removed from matrix 350. Likewise, P top 324 and N bottom 322 have been removed from matrix 352. This removal can occur by using an appropriate solvent to remove bonding media 344. The solvent used may be chosen such that it is capable of removing bonding media 344 without being capable of removing the bonding media used to couple top base plate 354 to matrix 350 and bottom base plate 356 to matrix 352. In one embodiment, the solvent may be n-methyl pyrrolidone.

Figure 5M:
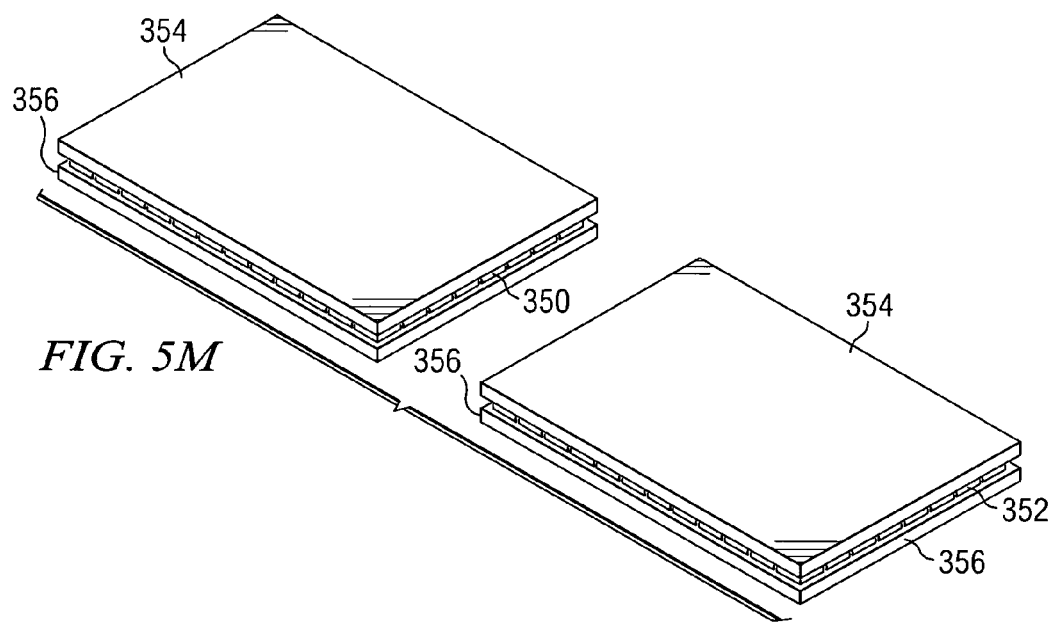

FIGS. 5L and 5M illustrate the coupling of bottom base plate 356 to matrix 350 and top base plate 354 to matrix 352. The coupling of bottom base plate 356 to matrix 350 and top base plate 354 to matrix 352 is accomplished by using a bonding media. In certain embodiments, the bonding media may be solder, conductive epoxy, or any other means for electrical and thermal connection. The result of these couplings, after appropriate orienting, are two identical thermoelectric modules, as shown in FIG. 5M.

Each top base plate 354 and bottom base plate 356 may include electrical interconnections, such as patterned metallizations, which serve to couple thermoelectric materials 346 and 348 electrically in series and thermally in parallel. The electrical interconnections in the illustrated embodiment are different for top base plates 354 and bottom base plates 356. The different electrical interconnections, and the fact that matrix 350 is a mirror image of matrix 352, results in the coupling of matrix 350 to top base plate 354 prior to coupling matrix 350 to bottom base plate 356, and the coupling of matrix 352 to bottom base plate 356 prior to coupling matrix 352 to top base plate 354.

Figure 6:
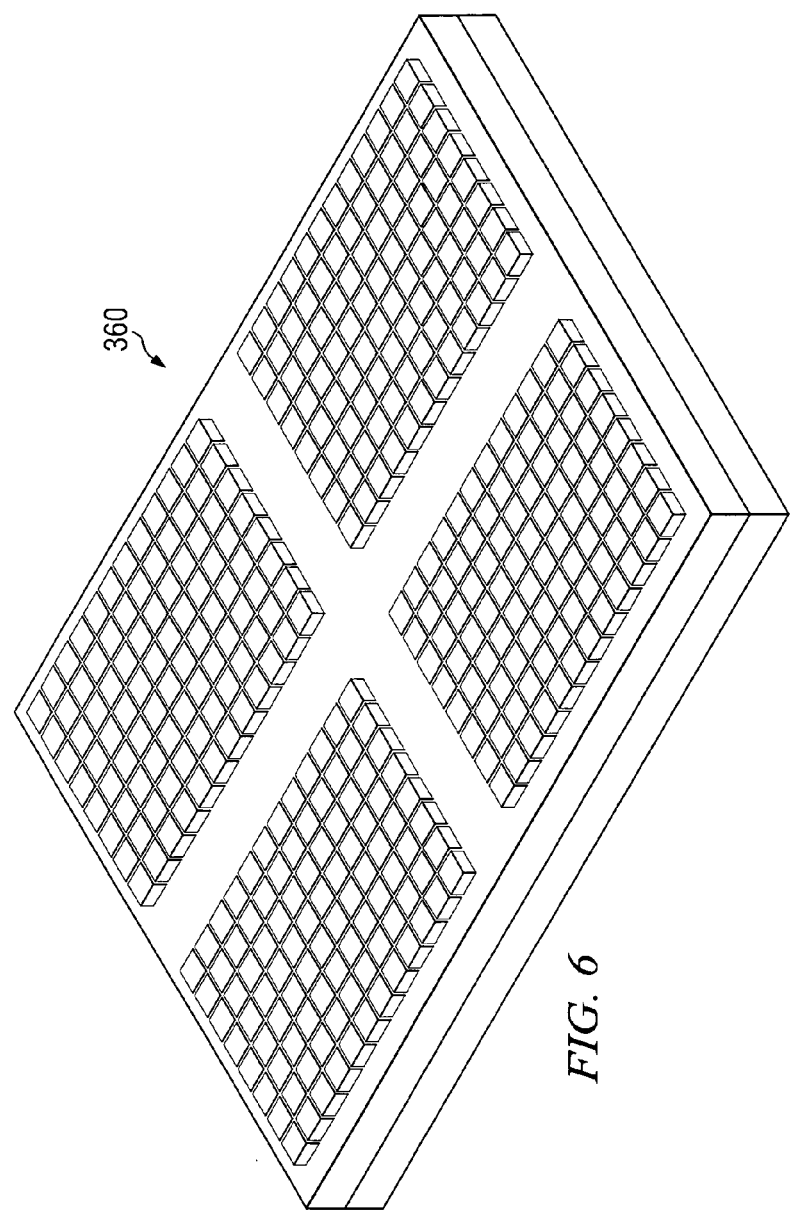
FIG. 6 illustrates a further alternative embodiment of a method of manufacturing thermoelectric devices having multiple thermoelectric elements.

Alternative embodiments may result in more than two thermoelectric modules being produced from method of manufacture 300. For instance, N substrate 320 and P substrate 330 may be subdivided into sections that allow for any number of matrices to be formed from a single N substrate 320 and a single P substrate 330. An example of such an embodiment containing four subdivisions is shown in FIG. 6.

Although the present invention has been described with several embodiments, a myriad of changes, variations, alterations, transformations, and modifications may be suggested to one skilled in the art. It is intended that the present invention encompass such changes, variations, alterations, transformations, and modifications as fall within the scope of the appended claims.

What is claimed is:

1. A method of manufacturing an array of thermoelectric elements, comprising:
    mounting a thermoelectric material to a temporary substrate wherein at least a portion of the thermoelectric material covers a removable pattern;
    segmenting the thermoelectric material; and
    removing the removable pattern and the portions of the thermoelectric material covering the removable pattern and leaving the portions of the thermoelectric material not covering the removable pattern attached to the temporary substrate.

2. The method of claim 1, wherein the removable pattern is applied to the temporary substrate by a method selected from the group consisting of printing, brushing, and spraying.

3. The method of claim 1, wherein the removable pattern is a water soluble material.

4. The method of claim 1, wherein the removable pattern is a solvent soluble material.

5. The method of claim 1, wherein the removable pattern is a checkered pattern of squares or rectangles.

6. The method of claim 1, wherein the thermoelectric material is segmented by dicing the thermoelectric material while it is mounted to the temporary substrate.

7. The method of claim 1, wherein the temporary substrate includes guide marks not covered by the thermoelectric material; and
    wherein the guide marks indicate the edges of the removable pattern and where to cut the thermoelectric material.

8. The method of claim 1, wherein the thermoelectric material is mounted to the temporary substrate using an epoxy; and
    wherein the removable pattern may be removed by a solvent which does not remove the epoxy.

9. The method of claim 1, further comprising transferring the thermoelectric material from the temporary substrate to a permanent substrate after removing the removable pattern.

10. The method of claim 1, further comprising transferring the thermoelectric material from the temporary substrate to a plurality of permanent substrates after removing the removable pattern; and
    wherein the removable pattern comprises a plurality of removable patterns.

11. The method of claim 1, wherein the temporary substrate includes a checkered pattern of raised blocks; and
    wherein the removable pattern includes a plate with a checkered pattern of holes cut from it, the checkered pattern of holes corresponding to the checkered pattern of raised blocks on the temporary substrate.

12. The method of claim 11, further comprising coupling the removable pattern to the temporary substrate by inserting the checkered pattern of raised blocks into the checkered pattern of holes; and
    wherein after coupling the temporary substrate to the removable pattern the tops of the raised blocks are substantially flush with the top of the plate such that the a substantially flat surface is provided for mounting the thermoelectric material.

13. A method of manufacturing an array of thermoelectric elements, comprising:
    mounting a thermoelectric material to a temporary substrate;
    segmenting the thermoelectric material into blocks; and
    removing alternating blocks of the thermoelectric material using a removable pattern thereby leaving a pattern of the thermoelectric material on the temporary substrate.

14. The method of claim 13, wherein removing alternating blocks includes removing the removable pattern from the temporary substrate.

15. The method of claim 14, wherein the removable pattern is applied to the temporary substrate by a method selected from the group consisting of printing, brushing, and spraying.

16. The method of claim 14, wherein the removable pattern is a water soluble material.

17. The method of claim 14, wherein the removable pattern is a solvent soluble material.

18. The method of claim 14, wherein the removable pattern is a checkered pattern of squares or rectangles.

19. The method of claim 14, wherein the temporary substrate includes guide marks not covered by the thermoelectric material; and
    wherein the guide marks indicate the edges of the removable pattern and where to cut the thermoelectric material.

20. The method of claim 14, wherein the thermoelectric material is mounted to the temporary substrate using an epoxy; and
    wherein the removable pattern may be removed by a solvent which does not remove the epoxy.

21. The method of claim 14, further comprising transferring the material from the temporary substrate to a permanent substrate after removing the removable pattern.

22. The method of claim 14, further comprising transferring the thermoelectric material from the temporary substrate to a plurality of permanent substrates after removing the removable pattern; and
    wherein the removable pattern comprises a plurality of removable patterns.

23. The method of claim 14, wherein the temporary substrate includes a pattern of raised blocks; and
    wherein the removable pattern includes a plate with a pattern of holes cut from it, the pattern of holes corresponding to the pattern of raised blocks on the temporary substrate.

24. The method of claim 23, further comprising coupling the temporary substrate to the removable pattern by inserting the pattern of raised blocks into the pattern of holes; and
    wherein after coupling the temporary substrate to the removable pattern the tops of the raised blocks are substantially flush with the top of the plate such that the a substantially flat surface is provided for mounting the material.

25. A method of manufacturing a thermoelectric module, comprising:
    mounting a first thermoelectric material to a first temporary substrate;
    mounting a second thermoelectric material to a second temporary substrate;
    segmenting the first thermoelectric material and the second thermoelectric material into blocks;
    removing alternating blocks of the thermoelectric material using a first removable pattern thereby leaving a pattern of the first thermoelectric material and blank spaces on the first temporary substrate;

removing alternating blocks of the second thermoelectric material using a second removable pattern thereby leaving a pattern of the second thermoelectric material and blank spaces on the second temporary substrate; and forming a pattern of the first thermoelectric material and the second thermoelectric material.

26. The method of claim 25, wherein the first and second thermoelectric materials are segmented by dicing the first and second thermoelectric materials while they are mounted to the first and second temporary substrates.

27. The method of claim 25, wherein removing alternating blocks of the first thermoelectric material includes removing the first removable pattern from the first temporary substrate; and wherein removing alternating blocks of the second thermoelectric material includes removing the second removable pattern from the second temporary substrate.

28. The method of claim 27, wherein the first and second removable patterns are water soluble.

29. The method of claim 27, wherein the first and second removable patterns are solvent soluble material.

30. The method of claim 27, wherein the first and second removable patterns are applied to the first and second temporary substrates by a method selected from the group consisting of printing, brushing, and spraying.

31. The method of claim 27, further comprising:

transferring the first thermoelectric material from the first temporary substrate to a first permanent substrate after removing the first removable pattern;

transferring the second thermoelectric material from the second temporary substrate to a second permanent substrate after removing the second removable pattern; and wherein the pattern of the first thermoelectric material and the second thermoelectric material is formed by inverting the first permanent substrate and placing it on top of the second permanent substrate.

32. The method of claim 27, wherein the first temporary substrate includes a pattern of raised blocks;

wherein the first removable pattern includes a plate with a pattern of holes cut from it, the pattern of holes corresponding to the pattern of raised blocks on the first temporary substrate;

wherein the second temporary substrate includes a pattern of raised blocks; and wherein the second removable pattern includes a plate with a pattern of holes cut from it, the pattern of holes corresponding to the pattern of raised blocks on the second temporary substrate.

33. The method of claim 32, wherein forming a pattern of the first thermoelectric material and the second thermoelectric material includes removing the first removable pattern from the first temporary substrate, removing the second removable pattern from the second temporary substrate, and coupling the first removable pattern to the second temporary substrate.

34. The method of claim 33, further comprising forming a second pattern of the first thermoelectric material and the second thermoelectric material by coupling the second removable pattern to the first temporary substrate.

35. The method of claim 26, wherein the first and second temporary substrates include guide marks not covered by the first and second thermoelectric materials; and wherein the guide marks indicate the edges of the first and second removable patterns and where to cut the first and second thermoelectric materials.

36. The method of claim 26, wherein the first and second thermoelectric materials are mounted to the first and second temporary substrates using epoxy; and wherein the first and second removable patterns may be removed by a solvent which does not remove the epoxy.

37. A method of manufacturing a thermoelectric module, comprising:

mounting a first thermoelectric material to a first temporary substrate, wherein the first temporary substrate includes a first top and a first bottom;

mounting a second thermoelectric material to a second temporary substrate, wherein the second temporary substrate includes a second top and a second bottom;

cutting the first thermoelectric material and the second thermoelectric material into blocks;

removing alternating blocks of the first thermoelectric material by removing the first top, and wherein after removing the first top a checkered pattern of the first thermoelectric material and blank spaces are left on the first bottom;

removing alternating blocks of the second thermoelectric material by removing the second top, and wherein after removing the second top a checkered pattern of the second thermoelectric material and blank spaces are left on the second bottom;

forming a first checkered pattern of the first thermoelectric material and the second thermoelectric material by placing the first top on the second bottom;

coupling the first checkered pattern of the first thermoelectric material and the second thermoelectric material to a first upper permanent substrate;

removing the first top and the second bottom from the first checkered pattern of the first thermoelectric material and the second thermoelectric material;

coupling a first lower permanent substrate to the first checkered pattern of the first thermoelectric material and the second thermoelectric material;

forming a second checkered pattern of the first thermoelectric material and the second thermoelectric material by placing the second top on the first bottom;

coupling the second checkered pattern of the first thermoelectric material and the second thermoelectric material to a second lower permanent substrate;

removing the second top and the first bottom from the second checkered pattern of the first thermoelectric material and the second thermoelectric material; and coupling a second upper permanent substrate to the second checkered pattern of the first thermoelectric material and the second thermoelectric material.

* * * * *